(12) United States Patent
Kraus et al.

(10) Patent No.: US 10,937,678 B2
(45) Date of Patent: Mar. 2, 2021

(54) SUBSTRATE SUPPORT WITH MULTIPLE EMBEDDED ELECTRODES

(71) Applicant: Applied Materials, Inc., Santa Clara, CA (US)

(72) Inventors: Philip Allan Kraus, San Jose, CA (US); Thai Cheng Chua, Cupertino, CA (US); Jaeyong Cho, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/714,144

(22) Filed: Dec. 13, 2019

(65) Prior Publication Data

US 2020/0118861 A1 Apr. 16, 2020

Related U.S. Application Data

(62) Division of application No. 15/710,753, filed on Sep. 20, 2017, now Pat. No. 10,510,575.

(51) Int. Cl.

| H01L 21/683 | (2006.01) |
|---|---|
| H01L 21/687 | (2006.01) |
| H01L 21/67 | (2006.01) |
| H01L 21/3065 | (2006.01) |
| H01L 21/223 | (2006.01) |
| H01L 21/02 | (2006.01) |
| H01J 37/00 | (2006.01) |

(52) U.S. Cl.
CPC .......... *H01L 21/6833* (2013.01); *H01J 37/00* (2013.01); *H01L 21/0262* (2013.01); *H01L 21/2236* (2013.01); *H01L 21/3065* (2013.01); *H01L 21/67069* (2013.01); *H01L 21/67109* (2013.01); *H01L 21/68742* (2013.01)

(58) Field of Classification Search
CPC ............. H01L 21/6831; H01L 21/6833; H01L 21/67069
USPC ................... 118/715–733; 156/345.1–345.55
See application file for complete search history.

(56) References Cited

U.S. PATENT DOCUMENTS

| 4,070,589 A | 1/1978 | Martinkovic |
|---|---|---|
| 4,340,462 A | 7/1982 | Koch |

(Continued)

FOREIGN PATENT DOCUMENTS

| CN | 1814857 A | 8/2006 |
|---|---|---|
| JP | 2002-313899 A | 10/2002 |

(Continued)

OTHER PUBLICATIONS

Dorf et al., U.S. Appl. No. 15/618,082, filed Jun. 8, 2017.

(Continued)

*Primary Examiner* — Charlee J. C. Bennett
(74) *Attorney, Agent, or Firm* — Patterson + Sheridan LLP

(57) ABSTRACT

A method and apparatus for biasing regions of a substrate in a plasma assisted processing chamber are provided. Biasing of the substrate, or regions thereof, increases the potential difference between the substrate and a plasma formed in the processing chamber thereby accelerating ions from the plasma towards the active surfaces of the substrate regions. A plurality of bias electrodes herein are spatially arranged across the substrate support in a pattern that is advantageous for managing uniformity of processing results across the substrate.

17 Claims, 3 Drawing Sheets

(56) References Cited

U.S. PATENT DOCUMENTS

| | | |
|---|---|---|
| 4,504,895 A | 3/1985 | Steigerwald |
| 4,931,135 A | 6/1990 | Horiuchi et al. |
| 4,992,919 A | 2/1991 | Lee et al. |
| 5,140,510 A | 8/1992 | Myers |
| 5,451,846 A | 9/1995 | Peterson et al. |
| 5,610,452 A | 3/1997 | Shimer et al. |
| 5,770,023 A | 6/1998 | Sellers |
| 5,796,598 A | 8/1998 | Nowak et al. |
| 5,810,982 A | 9/1998 | Sellers |
| 6,051,114 A | 4/2000 | Yao et al. |
| 6,055,150 A | 4/2000 | Clinton et al. |
| 6,099,697 A | 8/2000 | Hausmann |
| 6,187,685 B1 | 2/2001 | Hopkins et al. |
| 6,201,208 B1 | 3/2001 | Wendt et al. |
| 6,253,704 B1 | 7/2001 | Savas |
| 6,392,187 B1 | 5/2002 | Johnson |
| 6,483,731 B1 | 11/2002 | Isurin et al. |
| 6,863,020 B2 | 3/2005 | Mitrovic et al. |
| 6,947,300 B2 | 9/2005 | Pai et al. |
| 7,126,808 B2 | 10/2006 | Koo et al. |
| 7,601,246 B2 | 10/2009 | Kim et al. |
| 7,718,538 B2 | 5/2010 | Kim et al. |
| 7,888,240 B2 | 2/2011 | Hamamjy et al. |
| 8,129,653 B2 | 3/2012 | Kirchmeier et al. |
| 8,382,999 B2 | 2/2013 | Agarwal et al. |
| 8,383,001 B2 | 2/2013 | Mochiki et al. |
| 8,422,193 B2 | 4/2013 | Tao et al. |
| 8,603,293 B2 | 12/2013 | Koshiishi et al. |
| 8,828,883 B2 | 9/2014 | Rueger |
| 8,845,810 B2 | 9/2014 | Hwang |
| 8,916,056 B2 | 12/2014 | Koo et al. |
| 8,926,850 B2 | 1/2015 | Singh et al. |
| 8,963,377 B2 | 2/2015 | Ziemba et al. |
| 9,039,871 B2 | 5/2015 | Nauman et al. |
| 9,101,038 B2 | 8/2015 | Singh et al. |
| 9,105,447 B2 | 8/2015 | Brouk et al. |
| 9,105,452 B2 | 8/2015 | Jeon et al. |
| 9,129,776 B2 | 9/2015 | Finley et al. |
| 9,150,960 B2 | 10/2015 | Nauman et al. |
| 9,208,992 B2 | 12/2015 | Brouk et al. |
| 9,210,790 B2 | 12/2015 | Hoffman et al. |
| 9,224,579 B2 | 12/2015 | Finley et al. |
| 9,226,380 B2 | 12/2015 | Finley |
| 9,287,086 B2 | 3/2016 | Brouk et al. |
| 9,287,092 B2 | 3/2016 | Brouk et al. |
| 9,287,098 B2 | 3/2016 | Finley |
| 9,306,533 B1 | 4/2016 | Mavretic |
| 9,309,594 B2 | 4/2016 | Hoffman et al. |
| 9,362,089 B2 | 6/2016 | Brouk et al. |
| 9,435,029 B2 | 9/2016 | Brouk et al. |
| 9,483,066 B2 | 11/2016 | Finley |
| 9,490,107 B2 | 11/2016 | Kim et al. |
| 9,495,563 B2 | 11/2016 | Ziemba et al. |
| 9,520,269 B2 | 12/2016 | Finley et al. |
| 9,558,917 B2 | 1/2017 | Finley et al. |
| 9,583,357 B1 | 2/2017 | Long et al. |
| 9,601,283 B2 | 3/2017 | Ziemba et al. |
| 9,601,319 B1 | 3/2017 | Bravo et al. |
| 9,620,340 B2 | 4/2017 | Finley |
| 9,620,376 B2 | 4/2017 | Kamp et al. |
| 9,620,987 B2 | 4/2017 | Alexander et al. |
| 9,651,957 B1 | 5/2017 | Finley |
| 9,655,221 B2 | 5/2017 | Ziemba et al. |
| 9,685,297 B2 | 6/2017 | Carter et al. |
| 9,706,630 B2 | 7/2017 | Miller et al. |
| 9,728,429 B2 | 8/2017 | Ricci et al. |
| 9,761,459 B2 | 9/2017 | Long et al. |
| 9,767,988 B2 | 9/2017 | Brouk et al. |
| 9,852,889 B1 | 12/2017 | Kellogg et al. |
| 9,881,820 B2 | 1/2018 | Wong et al. |
| 9,929,004 B2 | 3/2018 | Ziemba et al. |
| 9,960,763 B2 | 5/2018 | Miller et al. |
| 10,020,800 B2 | 7/2018 | Prager et al. |
| 10,027,314 B2 | 7/2018 | Prager et al. |
| 10,224,822 B2 | 3/2019 | Miller et al. |
| 2002/0069971 A1 | 6/2002 | Kaji et al. |
| 2003/0029859 A1* | 2/2003 | Knoot ............ H01L 21/67248 219/483 |
| 2003/0137791 A1 | 7/2003 | Arnet et al. |
| 2004/0066601 A1 | 4/2004 | Larsen |
| 2005/0152159 A1 | 7/2005 | Isurin et al. |
| 2006/0075969 A1 | 4/2006 | Fischer |
| 2006/0130767 A1 | 6/2006 | Herchen |
| 2006/0139843 A1 | 6/2006 | Kim |
| 2006/0158823 A1 | 7/2006 | Mizuno et al. |
| 2007/0114981 A1 | 5/2007 | Vasquez et al. |
| 2007/0196977 A1 | 8/2007 | Wang et al. |
| 2007/0285869 A1 | 12/2007 | Howald |
| 2008/0106842 A1 | 5/2008 | Ito et al. |
| 2008/0135401 A1 | 6/2008 | Kadlec et al. |
| 2008/0252225 A1 | 10/2008 | Kurachi et al. |
| 2008/0272706 A1 | 11/2008 | Kwon et al. |
| 2008/0289576 A1 | 11/2008 | Lee et al. |
| 2009/0016549 A1 | 1/2009 | French et al. |
| 2010/0072172 A1 | 3/2010 | Ui et al. |
| 2010/0193491 A1 | 8/2010 | Cho et al. |
| 2010/0271744 A1 | 10/2010 | Ni et al. |
| 2010/0276273 A1 | 11/2010 | Heckman et al. |
| 2011/0096461 A1 | 4/2011 | Yoshikawa et al. |
| 2011/0100807 A1* | 5/2011 | Matsubara ............ H05H 1/46 204/298.08 |
| 2011/0157760 A1* | 6/2011 | Willwerth ........ H01L 21/6833 361/234 |
| 2011/0259851 A1 | 10/2011 | Brouk et al. |
| 2011/0281438 A1 | 11/2011 | Lee et al. |
| 2012/0000421 A1 | 1/2012 | Miller et al. |
| 2012/0052599 A1 | 3/2012 | Brouk et al. |
| 2012/0081350 A1 | 4/2012 | Sano et al. |
| 2012/0088371 A1 | 4/2012 | Ranjan et al. |
| 2012/0319584 A1 | 12/2012 | Brouk et al. |
| 2013/0175575 A1 | 7/2013 | Ziemba et al. |
| 2014/0062495 A1 | 3/2014 | Carter et al. |
| 2014/0077611 A1 | 3/2014 | Young et al. |
| 2014/0154819 A1 | 6/2014 | Gaff et al. |
| 2014/0262755 A1 | 9/2014 | Deshmukh et al. |
| 2014/0263182 A1* | 9/2014 | Chen ............ H01J 37/32091 216/71 |
| 2014/0273487 A1 | 9/2014 | Deshmukh et al. |
| 2015/0043123 A1 | 2/2015 | Cox |
| 2015/0084509 A1 | 3/2015 | Yuzurihara et al. |
| 2015/0130525 A1 | 5/2015 | Miller et al. |
| 2015/0181683 A1 | 6/2015 | Singh et al. |
| 2015/0256086 A1 | 9/2015 | Miller et al. |
| 2015/0303914 A1 | 10/2015 | Ziemba et al. |
| 2015/0318846 A1 | 11/2015 | Prager et al. |
| 2015/0325413 A1 | 11/2015 | Kim et al. |
| 2016/0020072 A1 | 1/2016 | Brouk et al. |
| 2016/0056017 A1 | 2/2016 | Kim et al. |
| 2016/0241234 A1 | 8/2016 | Mavretic |
| 2016/0314946 A1 | 10/2016 | Pelleymounter |
| 2016/0322242 A1 | 11/2016 | Nguyen et al. |
| 2016/0327029 A1 | 11/2016 | Ziemba et al. |
| 2017/0011887 A1 | 1/2017 | Deshmukh et al. |
| 2017/0018411 A1 | 1/2017 | Sriraman et al. |
| 2017/0022604 A1 | 1/2017 | Christie et al. |
| 2017/0069462 A1 | 3/2017 | Kanarik et al. |
| 2017/0076962 A1 | 3/2017 | Engelhardt |
| 2017/0098549 A1 | 4/2017 | Agarwal |
| 2017/0110335 A1 | 4/2017 | Yang et al. |
| 2017/0110358 A1 | 4/2017 | Sadjadi et al. |
| 2017/0113355 A1 | 4/2017 | Genetti et al. |
| 2017/0115657 A1 | 4/2017 | Trussell et al. |
| 2017/0117172 A1 | 4/2017 | Genetti et al. |
| 2017/0154726 A1 | 6/2017 | Prager et al. |
| 2017/0163254 A1 | 6/2017 | Ziemba et al. |
| 2017/0169996 A1 | 6/2017 | Ui et al. |
| 2017/0170449 A1 | 6/2017 | Alexander et al. |
| 2017/0178917 A1 | 6/2017 | Kamp et al. |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0243731 A1 | 8/2017 | Ziemba et al. |
| 2017/0250056 A1 | 8/2017 | Boswell et al. |
| 2017/0263478 A1 | 9/2017 | McChesney et al. |

(56) References Cited

U.S. PATENT DOCUMENTS

| | | |
|---|---|---|
| 2017/0278665 A1 | 9/2017 | Carter et al. |
| 2017/0311431 A1 | 10/2017 | Park |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0358431 A1 | 12/2017 | Dorf et al. |
| 2017/0366173 A1 | 12/2017 | Miller et al. |
| 2017/0372912 A1 | 12/2017 | Long et al. |
| 2018/0019100 A1 | 1/2018 | Brouk et al. |
| 2018/0102769 A1 | 4/2018 | Prager et al. |
| 2018/0166249 A1 | 6/2018 | Dorf et al. |
| 2018/0189524 A1 | 7/2018 | Miller et al. |
| 2018/0204708 A1 | 7/2018 | Tan et al. |
| 2018/0205369 A1 | 7/2018 | Prager et al. |
| 2018/0226225 A1 | 8/2018 | Koh et al. |
| 2018/0226896 A1 | 8/2018 | Miller et al. |
| 2018/0253570 A1 | 9/2018 | Miller et al. |
| 2018/0286636 A1 | 10/2018 | Ziemba et al. |
| 2018/0294566 A1 | 10/2018 | Wang et al. |
| 2018/0331655 A1 | 11/2018 | Prager et al. |
| 2019/0080884 A1 | 3/2019 | Ziemba et al. |
| 2019/0096633 A1 | 3/2019 | Pankratz et al. |

FOREIGN PATENT DOCUMENTS

| | | |
|---|---|---|
| JP | 2008-300491 A | 12/2008 |
| JP | 2016-225439 A | 12/2016 |
| KR | 10-2007-0098556 A | 10/2007 |
| TW | 498706 B | 8/2002 |
| TW | 200406021 A | 4/2004 |
| WO | 2015073921 A8 | 5/2016 |

OTHER PUBLICATIONS

Dorf et al., U.S. Appl. No. 62/433,204, filed Dec. 12, 2016.
Koh et al., U.S. Appl. No. 15/424,405, filed Feb. 3, 2017.
PCT International Search Report and Written Opinion dated Nov. 7, 2018, for International Application No. PCT/US2018/042956.
Wang, S.B., et al.—"Control of ion energy distribution at substrates during plasma processing," Journal of Applied Physics, vol. 88, No. 2, Jul. 15, 2000, pp. 643-646.
Taiwan Office Action for Application No. 107125613 dated Dec. 24, 2020, 16 pages.

* cited by examiner

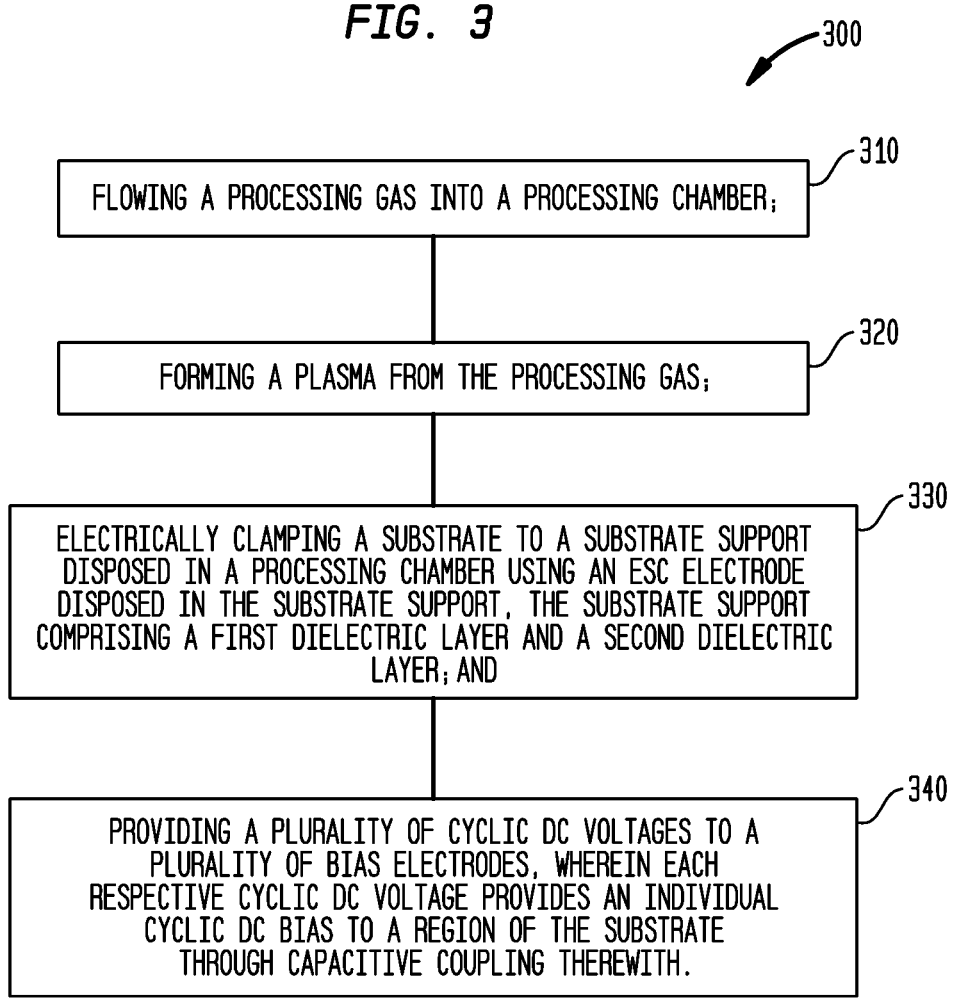

SUBSTRATE SUPPORT WITH MULTIPLE EMBEDDED ELECTRODES

CROSS-REFERENCE TO RELATED APPLICATIONS

This application is a divisional of co-pending U.S. patent application Ser. No. 15/710,753, filed Sep. 20, 2017, which will issue as U.S. Pat. No. 10,510,575 on Dec. 17, 2019, which is herein incorporated by reference in its entirety.

BACKGROUND

Field

Embodiments described herein generally relate to processing chambers used in semiconductor manufacturing, in particular, to processing chambers having a substrate support assembly configured to bias a substrate and method of biasing the substrate.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process to form high aspect ratio openings in a material layer, such as a dielectric layer, of a substrate. In a typical plasma assisted etching process, a plasma is formed in the processing chamber and ions from the plasma are accelerated towards the substrate, and openings formed in a mask thereon, to form openings in a material layer beneath the mask surface. Typically, the ions are accelerated towards the substrate by coupling a low frequency RF power in the range of 400 kHz to 2 MHz to the substrate thereby creating a bias voltage thereon. However, coupling an RF power to the substrate does not apply a single voltage to the substrate relative to the plasma. In commonly used configurations, the potential difference between the substrate and the plasma oscillates from a near zero value to a maximum negative value at the frequency of the RF power. The lack of a single potential, accelerating ions from the plasma to the substrate, results in a large range of ion energies at the substrate surface and in the openings (features) being formed in the material layers thereof. In addition, the disparate ion trajectories that result from RF biasing produce large angular distributions of the ions relative to the substrate surface. Large ranges of ion energies are undesirable when etching the openings of high aspect ratio features as the ions do not reach the bottom of the features with sufficiently high energies to maintain desirable etch rates. Large angular distributions of ions relative to the substrate surface are undesirable as they lead to deformations of the feature profiles, such as necking and bowing in the vertical sidewalls thereof.

Accordingly, there is a need in the art for the ability to provide narrow ranges of high energy ions with low angular distributions at the material surface of a substrate during a plasma assisted etching process.

SUMMARY

The present disclosure generally relates to plasma assisted or plasma enhanced processing chambers. More specifically, embodiments herein relate to electrostatic chucking (ESC) substrate supports configured to provide individual pulsed (cyclic) DC voltages to regions of a substrate during plasma assisted or plasma enhanced semiconductor manufacturing processes and methods of biasing regions of the substrate.

In one embodiment, a substrate support assembly is provided that includes a substrate support, comprising a plurality of first electrodes within the substrate support, each electrode of the plurality of first electrodes electrically isolated from, and coplanar with, every other electrode of the plurality of first electrodes, wherein each electrode of the plurality of first electrodes is configured to provide a pulsed DC power to a region of a substrate through capacitive coupling therewith, and a second electrode disposed within the substrate support, and electrically isolated from the plurality of first electrodes, for electrically clamping the substrate to the substrate support.

Other embodiments provide a processing chamber comprising one or more sidewalls and a bottom defining a processing volume and a substrate support. The substrate support comprises a plurality of first electrodes within the substrate support, each electrode of the plurality of first electrodes electrically isolated from, and coplanar with, every other electrode of the plurality of first electrodes, wherein each electrode of the plurality of first electrodes is configured to provide a pulsed DC bias to a region of a substrate through capacitive coupling therewith, and a second electrode disposed within the substrate support, and electrically isolated from the plurality of first electrodes, for electrically clamping the substrate to the substrate support.

In another embodiment, a method of biasing a substrate with a plurality of cyclic DC voltages is provided. The method includes flowing a processing gas into the processing chamber, forming a plasma from the processing gas, electrically clamping the substrate to a substrate support disposed in a processing chamber, and biasing the substrate across a plurality of regions. Biasing the substrate across a plurality of regions comprises capacitively coupling a plurality of cyclic DC voltages, provided to a plurality of bias electrodes disposed in the substrate support through a switching system, to respective regions of the substrate through the capacitance of a first dielectric layer of the substrate support. The plurality of cyclic DC voltages herein includes a range of frequencies and/or multiple polarities.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3 is a flow diagram illustrating a method of biasing regions of a substrate during plasma assisted processing, according to embodiments described herein.

DETAILED DESCRIPTION

Embodiments of the present disclosure generally relate to plasma processing chambers, such as plasma assisted or plasma enhanced processing chambers. More specifically, embodiments herein relate to electrostatic chucking (ESC) substrate supports configured to provide capacitively coupled pulsed DC voltage to a substrate disposed thereon during plasma assisted or plasma enhanced semiconductor manufacturing processing. Capacitive coupling of the substrate to a cyclic DC power source (placing a pulsed DC bias on the substrate) increases the potential difference between the substrate and a plasma formed in the processing chamber thereby accelerating ions from the plasma towards the active surface of the substrate. In contrast to RF biasing, pulsed DC biasing provides a single potential for ions to accelerate from the plasma to the substrate. The substrate supports herein include a plurality of bias electrodes each independently coupled to portions of a pulsed DC power supply switching system and each configured to provide tunable biasing of a region of the substrate by capacitive coupling therewith. The plurality of bias electrodes herein are spatially arranged across the substrate support in patterns that are advantageous for managing uniformity of processing results across the substrate.

Figure 1:
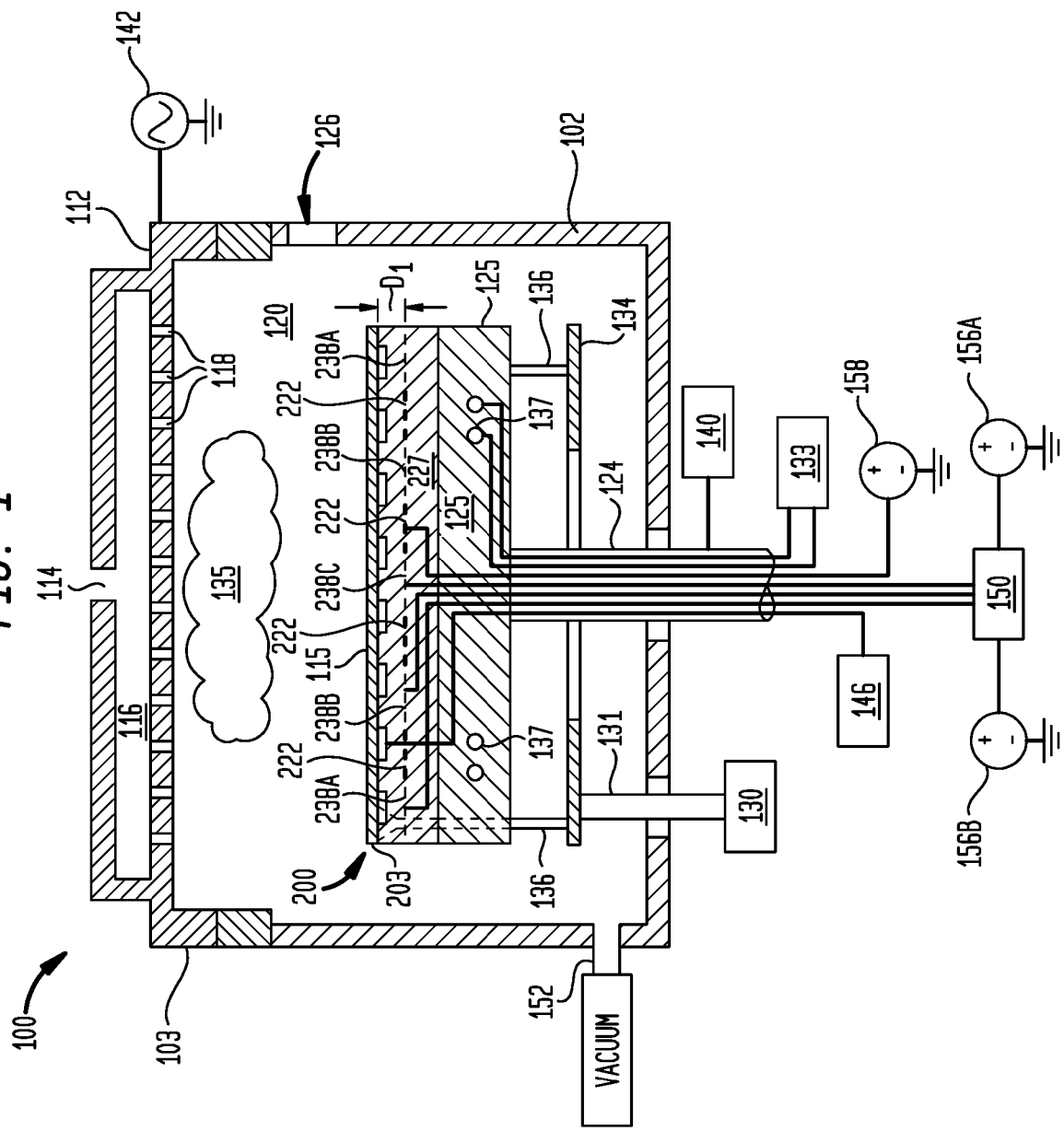
FIG. 1 is a schematic sectional view of a processing chamber with an electrostatic chucking (ESC) substrate support assembly disposed therein, according to one embodiment.

FIG. 1 is a schematic sectional view of a processing chamber 100 with an electrostatic chucking (ESC) substrate support assembly 200 disposed therein, according to one embodiment. In this embodiment, the processing chamber 100 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, or a plasma based ion implant chamber, for example a plasma doping (PLAD) chamber.

The processing chamber 100 features a chamber lid 103, one or more sidewalls 102, and a chamber bottom 104 which define a processing volume 120. A showerhead 112, having a plurality of openings 118 disposed therethrough, is disposed in the chamber lid 103 and is used to uniformly distribute processing gases from a gas inlet 114 into the processing volume 120. The showerhead 112 is coupled to an RF power supply 142, or in some embodiments a VHF power supply, which forms a plasma 135 from the processing gases through capacitive coupling therewith. The processing volume 120 is fluidly coupled to a vacuum, such as to one or more dedicated vacuum pumps, through a vacuum outlet 152 which maintains the processing volume 120 at sub-atmospheric conditions and evacuates processing, and other gases, therefrom. A substrate support assembly 200, disposed in the processing volume 120, is disposed on a support shaft 124 sealingly extending through the chamber bottom 104. The support shaft 124 is coupled to a controller 140 that raises and lowers the support shaft 124, and the substrate support assembly 200 disposed thereon, to facilitate processing of the substrate 115 and transfer of the substrate 115 to and from the processing chamber 100. Typically, when the substrate support assembly 200 is in a raised or processing position, the substrate 115 is spaced apart from the showerhead 112 between about 0.75 inches and 1.75 inches, such as about 1.25 inches.

The substrate 115 is loaded into the processing volume 120 through an opening 126 in one of the one or more sidewalls 102, which is conventionally sealed with a door or a valve (not shown) during substrate 115 processing. A plurality of lift pins 136 disposed above a lift pin hoop 134 are movably disposed through the substrate support assembly 200 to facilitate transferring of the substrate 115 thereto and therefrom. The lift pin hoop 134 is coupled to a lift hoop shaft 131 sealingly extending through the chamber bottom 104, which raises and lowers the lift pin hoop 134 by means of an actuator 130. The substrate support assembly 200 has a substrate support 227 on which a substrate is disposed for processing. When the lift pin hoop 134 is in a raised position, the plurality of lift pins 136 extend above the surface of the substrate support 227 lifting the substrate 115 therefrom and enabling access to the substrate 115 by a robot handler (not shown). When the lift pin hoop 134 is in a lowered position the plurality of lift pins 136 are flush with, or below, the surface of the substrate support 227 and the substrate 115 rests directly thereon for processing.

The substrate support assembly 200 herein includes a cooling base 125. The substrate support 227 is thermally coupled to, and disposed on, the cooling base 125. The cooling base 125 of the substrate support assembly 200 is used to regulate the temperature of the substrate support 227, and thereby the substrate 115 disposed on the substrate support surface 203, during processing. Herein, the cooling base 125 may include one or more fluid conduits 137 disposed therein that are fluidly coupled to, and in fluid communication with, a coolant source 133, such as a refrigerant source or water source. Typically, the cooling base 125 is formed of a corrosion resistant thermally conductive material, such as a corrosion resistant metal, for example aluminum, an aluminum alloy, or stainless steel and is thermally coupled to the substrate support 227 with an adhesive or by mechanical means.

During processing, ion bombardment of the substrate 115 will heat the substrate 115 to potentially undesirable high temperatures as the low pressure of the processing volume 120 results in poor thermal conduction between the substrate 115 and the substrate support surface 203. Therefore, in embodiments herein, a backside gas is provided between the substrate 115 and the substrate support surface 203 during processing, where the backside gas thermally couples the substrate 115 to the substrate support surface 203 and increases the heat transfer therebetween. Typically, the substrate support surface 203 includes a plurality of protrusions 228 extending therefrom that enable the backside side gas to flow or occupy space between the substrate 115 and the substrate support surface 203 when the substrate 115 is disposed thereon. The backside gas flows to the substrate support surface 203 through one or more gas conduits 147 disposed through the substrate support 227. Herein, the one or more gas conduits 147 are coupled to thermally conductive inert backside gas source 146, such as a Helium gas source.

Figure 2A:
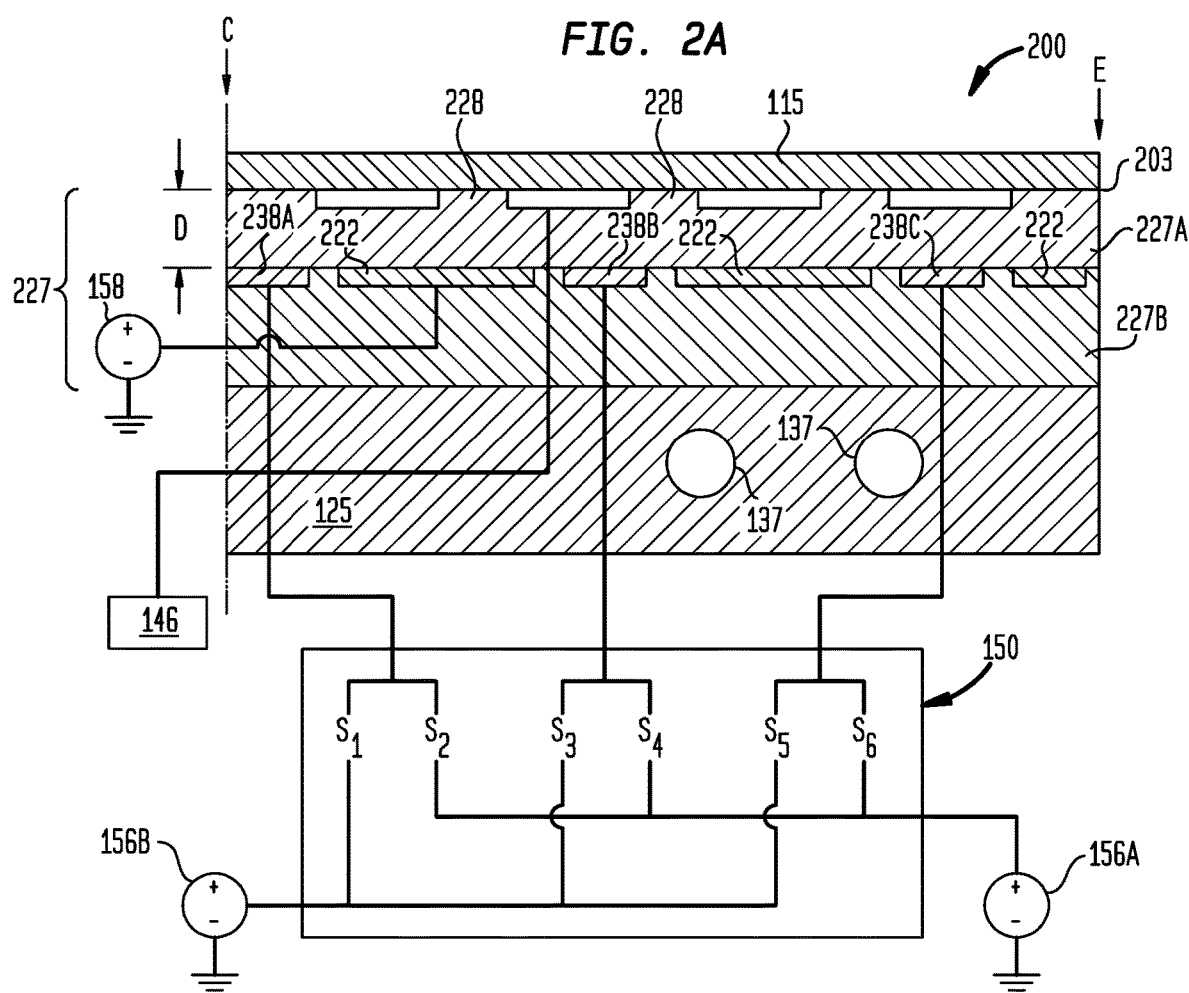
FIG. 2A is a close up sectional view of the substrate support assembly used in the processing chamber of FIG. 1.
Figure 2B:
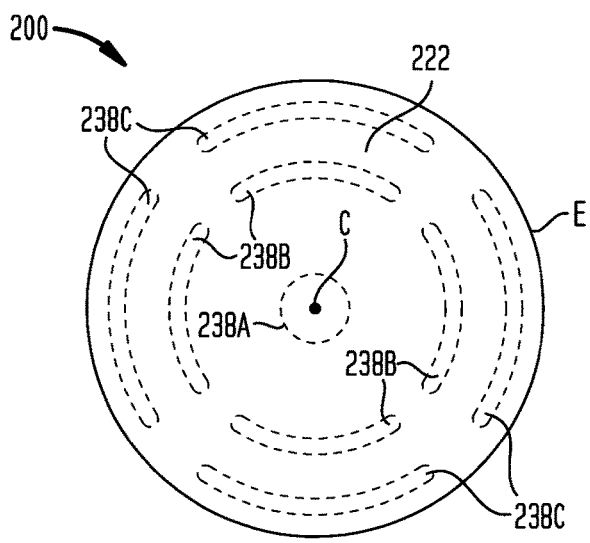
FIG. 2B is top down view of the substrate support assembly shown in FIG. 2A.

FIG. 2A is a close up sectional view of the substrate support assembly 200 used in the processing chamber 100 of FIG. 1. FIG. 2B is top down view of the substrate support assembly 200 shown in FIG. 2A. Herein, the substrate support 227 includes a first layer 227A and a second layer 227B where each layer 227AB is formed from a dielectric material comprising a metal oxide or metal nitride, or a dielectric layer comprising a mixture of metal oxides or metal nitrides, such as $Al_2O_3$, AlN, $Y_2O_3$, or combinations thereof. In some embodiments, the first layer 227A is formed of a dielectric material having a breakdown voltage of between about 20 V/μm and about 200 V/μm, such as between about 100 V/μm and about 200V/μm or between about 20 V/μm and about 100 V/μm. In one embodiment, the first layer 227A is formed of 99.5% alumina having a breakdown voltage of about 9 kV at about 160 μm. In some embodiments, the substrate support 227 is formed by bonding a bulk dielectric material to the second layer 227B and a plurality of electrodes disposed therein or thereon before grinding the bulk dielectric material to a desired thickness D to form the first layer 227A. Typically, the thickness D of the first layer 227A is between about 5 μm and about 300 μm, such as between about 100 μm and about 300 μm, for example about 160 μm. In other embodiments, the first layer 227A is formed using any suitable coating method, such as CVD, PECVD, ALD, PEALD, evaporation, sputtering, plasma arc coating, aerosol coating, or combinations thereof.

A plurality of electrodes disposed and/or embedded in the substrate support herein includes a plurality of bias electrodes 238A-C and a chucking electrode comprising a unitary conductive material part, e.g., the unitary ESC electrode 222. Each electrode of the plurality of bias electrodes is electrically isolated from every other electrode of the plurality of bias electrodes and from the unitary ESC electrode 222. Each electrode of the plurality of bias electrodes 238A-C herein is configured to provide one or more independent pulsed DC biases to respective regions of the substrate 115 through capacitive coupling therewith. The unitary ESC electrode 222 provides a clamping force between the substrate 115 and the substrate support surface 203 by providing a potential therebetween. Typically, the ESC electrode is coupled to a static DC power supply 158 which, herein, provides a voltage between about −5000 V and about 5000 V, such as between about 100 V and about 4000 V, such as between about 1000 V and about 3000 V, for example about 2000V.

In embodiments herein, the substrate support 227 may be configured to support a 300 mm diameter substrate and may include between 2 and 20 bias electrodes, such as the three bias electrodes 238A-C shown, however, larger substrate supports for processing larger substrates and/or substrates of different shapes may include any number of bias electrodes. The plurality of bias electrodes 238A-C are each formed of one or more electrically conductive material parts, such as a metal mesh, foil, plate, or combinations thereof. In some embodiments, each of the plurality of bias electrodes 238A-C are formed of more than one discontinuous electrically conductive material parts, such a plurality of metal meshes, foils, plates, or combinations thereof, that are electrically coupled with one or more connectors (not shown) disposed in the substrate support 227 so that the electrically coupled discontinuous material parts comprise a single electrode, such as the center bias electrode 238A, the intermediate bias electrode 238B, or the outer bias electrode 238C.

The plurality of bias electrodes 238A-C are spatially arranged across the substrate support 227 in a pattern that is advantageous for managing uniformity of processing results across the substrate 115. In the embodiment shown in FIG. 2A, the circular plate of the center bias electrode 238A and the discontinuous annuluses of the bias electrodes 238B-C define a plurality of concentric zones. Other spatial arrangements including spoke patterns, grid patterns, line patterns, spiral patterns, interdigitated patterns, random patterns, or combinations thereof, may be used. Each electrode of the plurality of bias electrodes 238A-C herein is coplanar with every other electrode of the plurality of bias electrodes and with the unitary ESC electrode 222. The unitary ESC electrode 222 is planarly disposed with the substrate support 227 and parallel to the substrate support surface 203. Each electrode of the plurality of bias electrodes 238A-C is electrically isolated from the unitary ESC electrode 222 by openings formed in the unitary ESC electrode 222 and by the dielectric material of the substrate support 227 disposed therebetween. In other embodiments, each electrode of the plurality of bias electrodes-238A-C, or a portion thereof, is coplanar with at least a portion of every other electrode of the plurality of bias electrodes, and the plurality of bias electrodes 238A-C is closer to the substrate support surface 203 than the unitary ESC electrode 222.

Herein, each of the plurality of bias electrodes 238A-C is independently electrically coupled to portions of a DC power supply switching system 150 comprising a plurality of solid state pulser/switchers, herein a plurality of first switches S1, S3, S5 and a plurality of second switches S2, S4, S6, are capable of converting a high voltage (HV) DC power to a cyclic DC voltage having a frequency between about 10 Hz, or lower, and about 100 kHZ. The plurality of first switches S1, S3, S5 and the plurality of second switches S2, S4, S6, are further capable of converting a high voltage (HV) DC power to a cyclic DC voltage having a duty cycle in the range 2% to 98%. The switches S1-S6 are operated cyclically at a frequency or are operated as needed according to any pattern, or no pattern. Each of the plurality of bias electrodes is electrically coupled to one of the plurality of first switches S1, S3, S5, and one of the plurality of second switches S2, S4, S6.

Herein, the plurality of first switches S1, S3, S5 are electrically coupled to a first DC voltage source 156B, which may be, for example, a positive (+ve) voltage source, and the plurality of second switches S2, S4, S6 are electrically coupled to a second DC voltage source 156A, which may be, for example, a negative (−ve) voltage source. In other embodiments, the two voltage sources 156A and 156B may both be positive, or both be negative, sources of different voltages. The first and second DC voltage sources 156B and 156A herein provide a DC bias, positive or negative, of between about 0V and about 10 kV in their respective voltage magnitudes.

Each set of switches, such as S1 and S2, S3 and S4, or S5 and S6, operates independently, providing individual frequencies, patterns, or operation of cyclic DC voltages of positive or negative polarity to respective bias electrodes 238A-C of the substrate support 227 and, through capacitive coupling therewith, providing an individual pulsed DC bias to respective regions of the substrate 115 disposed on the substrate support 227. Typically, coupling a negative DC pulse to a substrate region will increase the potential difference between the substrate region and the plasma 135, wherein the substrate region is at a more negative potential than the plasma during the pulse. In this case of negative DC bias, positively charged species in the plasma will accelerate towards the substrate region's surface, affecting a processing of the substrate region. Coupling a positive DC pulse to a substrate region will increase the potential difference between the substrate region and the plasma 135, wherein the substrate region is at a more positive potential than the plasma during the pulse. In this case of positive DC bias, negatively charged species in the plasma will accelerate towards the substrate region's surface, affecting a processing of the substrate region. The ability to adjust the frequency, duty cycle, and/or duration of the cyclic DC voltages, for both positive and negative DC bias conditions, provided to different substrate regions, allow for tuning of across-substrate processing uniformity and improvement thereof. Among other useful attributes, the ability to apply both positive and negative DC bias pulses provides for charge neutralization of the substrate regions, wherein the surface of the substrate region can be periodically brought to a neutral charge state.

FIG. 3 is a flow diagram illustrating a method 300 of biasing regions of a substrate during plasma assisted processing, according to embodiments described herein. At 310 the method 300 includes flowing a processing gas into the processing chamber and at 320 the method includes forming a plasma from the processing gas.

At 330 the method 300 includes electrically clamping a substrate to a substrate support disposed in a processing chamber using a chucking electrode disposed in the substrate support, the substrate support comprising a first dielectric layer and a second dielectric layer.

At 340 the method 300 includes providing a plurality of cyclic DC voltages to a plurality of bias electrodes disposed in the substrate support, wherein each respective cyclic DC voltage provides an individual pulsed DC bias to a region of the substrate through capacitive coupling therewith. In some embodiments, the plurality of cyclic DC voltages comprises more than one polarity, more than one frequency, more than one duty cycle, and/or more than one duration. The pulsed DC bias causes ions in the plasma formed at 330 to accelerate toward the substrate to perform a material process, such as deposition or removal, on the substrate. It should be noted that the plasma may also be formed after 320, after 330, or after 340.

The substrate support assembly and methods described herein enable capacitively coupled pulsed DC biasing of individual substrate regions during plasma assisted processing that is compatible with use of an electrostatic clamping force. Pulsed DC biasing allows for increased control of ion energy and angular distribution at the substrate surface and/or regions thereof and in feature openings formed therein. This increased control is desirable at least in forming high aspect ratio features and/or features requiring a square etch profile, such as silicon etch for shallow trench isolation (STI) applications or for silicon fins used in FinFET technologies. The ability to apply DC pulses of varying frequency, duty cycle, polarity, and/or duration to different regions of the substrate enables tuning of across-substrate processing uniformity and improvement thereof.

While the foregoing is directed to embodiments of the present disclosure, other and further embodiments of the disclosure may be devised without departing from the basic scope thereof, and the scope thereof is determined by the claims that follow.

The invention claimed is:

1. A method for processing a substrate, comprising:
   positioning the substrate on a substrate support that is disposed in a processing volume of a processing chamber;
   flowing a processing gas into the processing volume;
   forming a plasma of the processing gas; and
   biasing a plurality of regions of the substrate using a corresponding plurality of cyclic DC voltages, wherein
   each of the plurality of cyclic DC voltages is independently controlled using a pulsed DC bias switching system comprising a plurality of corresponding switching pairs, and
   a first switch of each of the switching pairs is electrically coupled to a first DC voltage source and a second switch of each of the switching pairs is electrically coupled to a second DC voltage source.

2. The method of claim 1, wherein
   the substrate support is formed of a dielectric material,
   an ESC electrode is disposed in the substrate support,
   a plurality of spatially arranged bias electrodes are disposed in the substrate support,
   each of the plurality of spatially arranged bias electrodes are electrically isolated from one another and from the ESC electrode by dielectric material of the substrate support disposed therebetween,
   each of the plurality of cyclic DC voltages is independently controlled using a DC power switching system comprising a plurality of first solid state switches coupled to a first DC power source and a plurality of second solid state switches coupled to a second DC power source, and
   each bias electrode is electrically coupled to one of the plurality of first solid state switches and to one of the plurality of second solid state switches.

3. The method of claim 1, further comprising reversing a polarity of at least one of the plurality of cyclic DC voltages during substrate processing.

4. The method of claim 1, wherein at least one of the plurality of cyclic DC voltages comprises a different frequency, duty cycle, pulse duration, polarity, or a combination thereof than that of another of the plurality of cyclic DC voltages.

5. The method of claim 1, further comprising reversing a polarity of at least one of the cyclic DC voltages during substrate processing.

6. The method of claim 1, wherein
   the substrate support comprises a plurality of bias electrodes embedded in a dielectric material,
   each of the plurality of bias electrodes is electrically isolated from every other electrode of the plurality of bias electrodes by the dielectric material, and biasing the plurality of regions of the substrate comprises capacitively coupling corresponding bias electrodes of the plurality of bias electrodes therewith.

7. The method of claim 6, wherein the substrate support further comprises a chucking electrode formed of a unitary conductive material part, and wherein the chucking electrode is electrically isolated from the plurality of bias electrodes by the dielectric material of the substrate support disposed therebetween.

8. The method of claim 6, further comprising electrostatically chucking the substrate to the substrate support using a chucking electrode embedded in the dielectric material.

9. The method of claim 6, wherein each of the plurality of cyclic DC voltages is delivered to a corresponding bias electrode of the plurality of bias electrodes using a corresponding one of the plurality of switching pairs.

10. A method for processing a substrate, comprising:
    positioning the substrate on a substrate support that is disposed in a processing volume of a processing chamber;
    flowing a processing gas into the processing volume;
    forming a plasma of the processing gas; and
    biasing a plurality of regions of the substrate using a corresponding plurality of cyclic DC voltages, wherein
    each of the plurality of cyclic DC voltages is independently controlled,
    the substrate support comprises a plurality of bias electrodes embedded in a dielectric material,
    each of the plurality of bias electrodes is electrically isolated from every other electrode of the plurality of bias electrodes by the dielectric material and biasing the plurality of regions of the substrate comprises capacitively coupling corresponding bias electrodes of the plurality of bias electrodes therewith, each of the plurality of cyclic DC voltages is delivered to a corresponding bias electrode of the plurality of bias electrodes using a corresponding one of a plurality of switching pairs, and first switches of each of the plurality of switching pairs are electrically coupled to a first DC voltage source, second switches of each of the plurality of switching pairs are electrically coupled to a second DC voltage source, and a polarity of the first DC voltage source is opposite of a polarity of the second DC voltage source.

11. A method for processing a substrate, comprising:

positioning a substrate on a substrate support that is disposed in a processing volume of a processing chamber;

flowing a processing gas into the processing volume;

forming a plasma of the processing gas; and biasing a plurality of regions of the substrate using a pulsed DC biasing system, the pulsed DC biasing system comprising:
   a plurality of first electrodes disposed in a substrate support, wherein
      each electrode of the plurality of first electrodes is electrically isolated from every other electrode of the plurality of first electrodes,
      each electrode of the plurality of first electrodes is configured to bias a region of the substrate through capacitive coupling therewith,
      each electrode of the plurality of first electrodes is independently electrically coupled to a respective switching pair of the pulsed DC biasing system,
      each switching pair comprises a distinct first switch and a distinct second switch,
      each of the switching pairs is configured to operate independently of the other switching pairs, and
      the first switches are electrically coupled to a first DC voltage source and the second switches are electrically coupled to a second DC voltage source.

12. The method of claim 11, wherein biasing the plurality of regions of the substrate comprises reversing a polarity of a cyclic DC voltage delivered to at least one of the first electrodes during substrate processing.

13. The method of claim 11, wherein biasing the plurality of regions of the substrate comprises delivering a cyclic DC voltage to at least one of plurality of first electrodes which has a different frequency, duty cycle, pulse duration, polarity, or a combination thereof than that of cyclic DC voltage delivered to a different one of the plurality of first electrodes.

14. The method of claim 11, further comprising electrostatically chucking the substrate to the substrate support using a second electrode embedded in a dielectric material thereof.

15. A method for processing a substrate, comprising:

positioning a substrate on a substrate support that is disposed in a processing volume of a processing chamber, wherein
   the substrate support is formed of a dielectric material,
   an ESC electrode is disposed in the substrate support,
   a plurality of spatially arranged bias electrodes are disposed in the substrate support, and
   each of the plurality of spatially arranged bias electrodes are electrically isolated from each other and from the ESC electrode by the dielectric material of the substrate support disposed therebetween;

flowing a processing gas into the processing volume;

forming a plasma of the processing gas;

electrically chucking the substrate to the substrate support using the ESC electrode; and biasing a plurality of regions of the substrate using a plurality of cyclic DC voltages delivered to corresponding ones of the plurality of spatially arranged bias electrodes, wherein
   each of the plurality of cyclic DC voltages is independently controlled using a DC power supply switching system comprising a plurality of first solid state switches coupled to a first DC power source and a plurality of second solid state switches coupled to a second DC power source, and
   each bias electrode is electrically coupled to one of the plurality of first solid state switches and to one of the plurality of second solid state switches.

16. The method of claim 15, wherein biasing the plurality of regions of the substrate comprises reversing a polarity of a cyclic DC voltage delivered to at least one of the bias electrodes during substrate processing.

17. The method of claim 15, wherein biasing the plurality of regions of the substrate comprises delivering a cyclic DC voltage to at least one of the plurality of bias electrodes which has a different frequency, duty cycle, pulse duration, polarity, or a combination thereof than that of cyclic DC voltage delivered to a different one of the plurality of bias electrodes.

* * * * *